United States Patent
Zhang

[11] Patent Number: 6,055,252
[45] Date of Patent: Apr. 25, 2000

[54] FIBEROPTIC TRANSMITTER USING THERMISTOR TO MAINTAIN STABLE OPERATING CONDITIONS OVER A RANGE OF TEMPERATURE

[75] Inventor: Jingcheng Zhang, San Jose, Calif.

[73] Assignee: Photonic Solutions, Inc., San Jose, Calif.

[21] Appl. No.: 09/151,056

[22] Filed: Sep. 10, 1998

[51] Int. Cl.$^7$ ................................ H01S 3/04
[52] U.S. Cl. .................. 372/34; 372/26; 372/6; 372/38
[58] Field of Search ................ 372/38, 34, 26, 372/6

[56] References Cited

U.S. PATENT DOCUMENTS

| 5,604,757 | 2/1997 | Liang et al. ........................ 372/34 |
| 5,760,939 | 6/1998 | Nagarajan et al. .................. 372/34 |
| 5,812,572 | 9/1998 | King et al. ........................ 372/26 |

FOREIGN PATENT DOCUMENTS

WO 98/00893  6/1997  WIPO ................ H01S 3/00

OTHER PUBLICATIONS

Document entitled: "MAXIM. Single +5V, Fully Integrated 1.2Gbps Laser Diode Driver," 1995, pp. 1–12; (Maxim Integrated Products, 120 Gabriel Drive, Sunnyvale, CA 94086 (408) 737–7600).
Document entitled: "SONY CXB1549Q, Laser Diode Driver, Preliminary," pp. 1–14 (PE98313–PS).
Document entitled: "SONY CXB1558Q–Y, Laser Driver," pp. 1–11 (E04720–PK).

*Primary Examiner*—Leon Scott, Jr.
*Attorney, Agent, or Firm*—Townsend and Townsend and Crew LLP

[57] ABSTRACT

Techniques for controlling the operation of a laser diode to maintain optimum operating characteristics (i.e., fairly constant output power and extinction ratio) despite the fact that the threshold current and slope efficiency vary greatly over a the desired range of operating temperature. A laser driving circuit includes a bias current generator, a temperature-dependent modulation current generator, and a switching element for switching the modulation current on and off in accordance with a desired input pattern. The modulation current is caused to vary with temperature in a manner that compensates for the fact that the laser diode's slope efficiency varies with temperature.

24 Claims, 12 Drawing Sheets

FIBEROPTIC TRANSMITTER USING THERMISTOR TO MAINTAIN STABLE OPERATING CONDITIONS OVER A RANGE OF TEMPERATURE

BACKGROUND OF THE INVENTION

The present invention relates generally to fiberoptic transmitters employing semiconductor laser diodes, and more particularly to techniques for operating and manufacturing the same.

Semiconductor laser diodes (often referred to below simply as lasers) are used in a variety of fiberoptic transmission systems for voice and data communications. As is well known, the output optical power of a forward-biased laser diode is a non-linear function of the drive current. For drive currents below a threshold current value $I_{th}$, the output power is low, and the laser diode operates in what is known as the LED mode of operation.

For drive currents in excess of the threshold current value, the semiconductor laser diode operates in what is known as the lasing mode of operation. In this mode, the output power rises generally linearly with increases in current according to a parameter referred to as the laser diode's slope efficiency. The slope efficiency (S) of a laser diode is defined as the ratio of change in optical output power to change in laser drive current while the laser diode is in the lasing mode. It is thus common to provide a fixed bias current source that generates a current near $I_{th}$ and a modulation current source that provides additional drive current. The modulation current is modulated in accordance with a desired data pattern.

One measure of the operation is the extinction ratio (ER), which is defined as the ratio of the optical power in a logical 1 to the optical power in a logical 0. In general, the extinction ratio depends on the threshold current, the laser diode's slope efficiency, the bias current, and the modulation current.

The threshold current $I_{th}$ varies from diode to diode, and changes with operating temperature and age. This has resulted in difficulties in setting an appropriate operating point, or bias current, for the laser diode. One approach was to pick a suitable operating point for the particular laser diode at a particular operating temperature. However, because of the temperature characteristics of typical laser diodes, such prior art controllers would typically require a thermoelectric cooler (TEC) or other temperature control mechanism, leading to additional manufacturing and operating costs, as such cooling mechanisms are prone to failure in the field.

Published PCT Application No. WO 98/00893 [PCT/US97/112321] discloses a fiberoptic transmitter module that operates satisfactorily over a wide range of temperature without requiring a TEC. During calibration of a module, the module's laser diode is characterized over a defined operating temperature range. Characteristic data and/or curves defining the operational characteristics of the laser diode over the range of operating conditions (temperature, power supply) are stored in a non-volatile memory such as an EEPROM. During operation, an embedded microcontroller, together with analog-to-digital converters, digital-to-analog converters, and other associated circuitry, dynamically controls the operational parameters (e.g., modulation and bias current) based on the current operating conditions (temperature, power supply).

This design is extremely effective and powerful. However, the use of a microcontroller and the associated analog-to-digital converters and digital-to-analog converters tends to increase the size and cost of the module.

SUMMARY OF THE INVENTION

The present invention provides techniques for controlling the operation of a laser diode to maintain optimum operating characteristics (i.e., fairly constant output power and extinction ratio) despite the fact that the threshold current and slope efficiency vary greatly over a the desired range of operating temperature. This can be accomplished without the need for thermoelectric coolers or the like.

In short, a laser driving circuit embodiment of the invention includes a bias current generator, a temperature-dependent modulation current generator, and a switching element for switching the modulation current on and off in accordance with a desired input pattern. The modulation current is caused to vary with temperature in a manner that compensates for the fact that the laser diode's slope efficiency varies with temperature. A module incorporating the laser driving circuit and the laser can be implemented in a compact configuration. In some embodiments, other mechanisms are provided to maintain the bias current at a level that results in a desired average output power from the laser diode.

In specific embodiments, the temperature-dependent modulation current generator includes a modulation current source that provides an output current that is a function of an input reference current, and a reference current source having an element with a characteristic that varies with temperature. The reference current source can be implemented as a reference voltage generator applied to a resistor-thermistor network. Since the slope efficiency of most laser diodes decreases with temperature, the thermistor should have a negative temperature coefficient. The bias current generator may include a bias current source that provides an output current that is a function of an input reference current.

In one implementation, the bias current source, the modulation current source, the reference voltage generator, and the switching element are portions of a commercially available integrated laser diode driver chip, while the temperature-dependent resistor-thermistor network is outside the chip.

A calibration technique according to the invention includes determining the temperature-dependence of the laser diode's slope efficiency (if not already provided by the laser manufacturer), calculating a temperature-dependence of a required modulation current to maintain a target extinction ratio and average power, determining a set of parameters for the temperature-dependent element so as to match the temperature-dependence of the required modulation current, and configuring the laser diode transmitter module with circuit elements having parameters, so determined. The calibration may also include determining parameters for establishing desired bias current and average output power.

In instances where the set of parameters includes a set of thermistor parameters and a set of resistor parameters, the calibration can typically be carried out for additional laser diode transmitter modules having nominally the same type of laser diode without having to determine the thermistor parameters, but rather only adjusting one resistor parameter for each laser diode transmitter module.

A further understanding of the nature and advantages of the present invention may be realized by reference to the remaining portions of the specification and the drawings.

BRIEF DESCRIPTION OF THE DRAWINGS

FIGS. 8A–18C include plots of extinction ratio as a function of temperature for different lasers and different laser driver chips;

FIG. 12 is a block diagram showing the disposition of a laser diode fiberoptic transmitter module in a network environment.

DESCRIPTION OF SPECIFIC EMBODIMENTS

Overview of Laser Diode Behavior as a Function of Temperature

Figure 1:
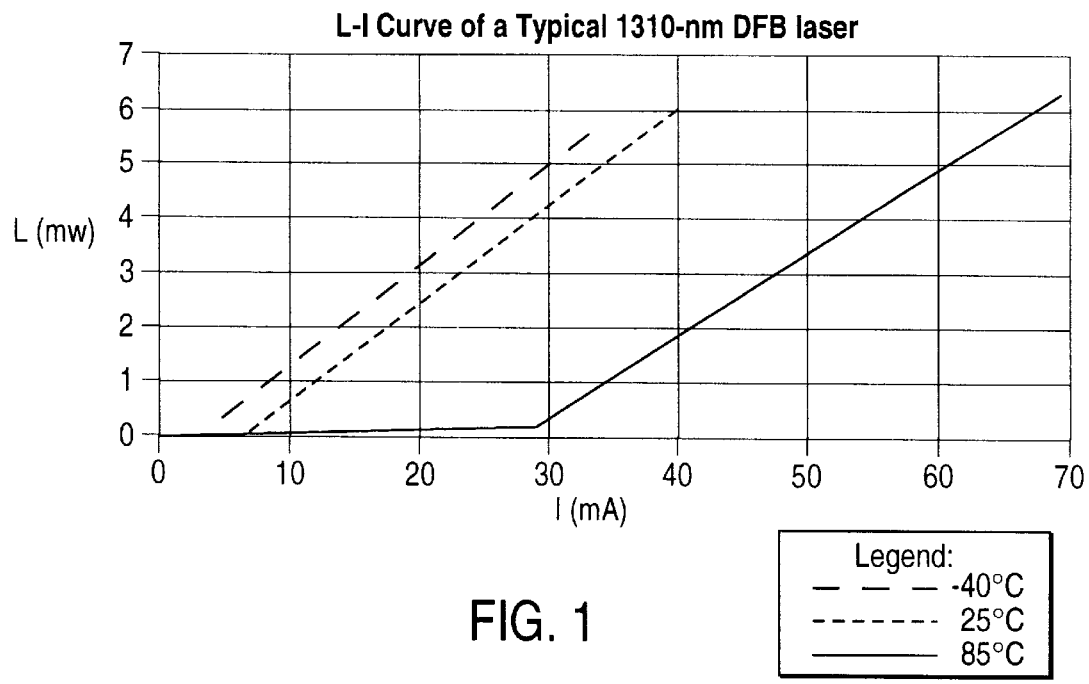
FIG. 1 includes plots of laser diode optical output power (L) as a function of laser drive current (I) for a number of different temperatures.

FIG. 1 includes plots of the optical output power (L) versus forward bias drive current (I) of a typical laser diode. The figure includes L-I curves for a plurality of different operating temperatures. As can be seen in FIG. 1, the output power is a non-linear function of the drive current. For drive currents below a threshold current value $I_{th}$, the output power is very low (and fairly constant), and the laser diode operates in what is known as the LED mode of operation.

For drive currents above $I_{th}$, the semiconductor laser diode operates in what is known as the lasing mode of operation. In this mode, the output power rises generally linearly with increases in drive current according to a parameter referred to as the laser diode's slope efficiency. The transition between the two modes is sometimes referred to as the knee, since it manifests itself as a sharp bend in the L-I curve.

In operation, it is common practice to provide a fixed bias current source that generates a current at or near (above or below) $I_{th}$ and a modulation current source that provides additional drive current. The modulation current is modulated in accordance with a desired data pattern. As mentioned above, important measures of the laser diode's operation are the output power and the extinction ratio (ER). The extinction ratio is defined as the ratio of the optical power in a logical 1 to the optical power in a logical 0. It is assumed that a logical 0 is achieved with no modulation current and a logical 1 is achieved with a particular amount of modulation current $I_{mod}$.

Two additional facts can be seen from the figure. First, the threshold current rises as a function of temperature; and second, the slope efficiency falls off as a function of temperature. In many optical transmission systems, specifically telecommunication systems, the transmission system must operate reliably and consistently over a wide temperature range. An exemplary temperature range is −40° C. to +85° C. A laser diode's operating characteristics can change dramatically over such a wide operating temperature range. For example, quantum well distributed feedback (DFB) lasers, which are sometimes utilized in long-haul telecommunication systems, will typically have a threshold current that changes by more than 1000% over this temperature range. In addition, the slope efficiency of the laser diode will also change over such a wide operating temperature.

Figure 2:
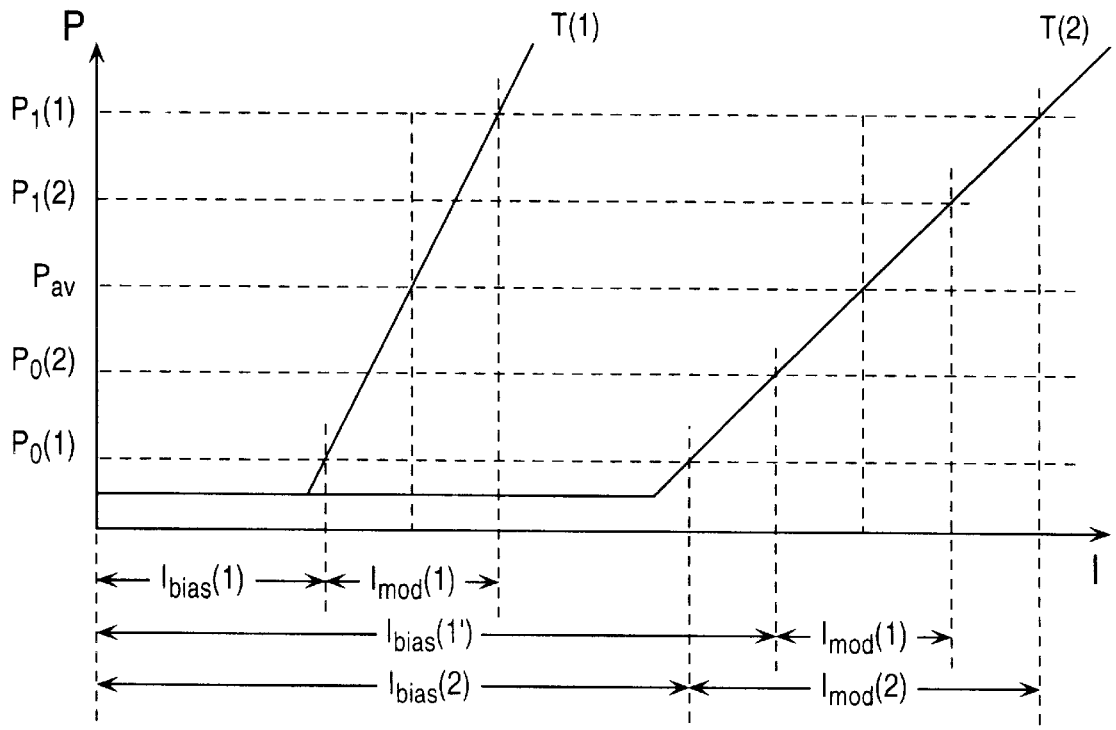
FIG. 2 is schematic plot showing conceptually why the extinction ratio falls off as a result in a decrease of slope efficiency with increasing temperature.

FIG. 2 is schematic plot showing conceptually why the extinction ratio falls off as a result in a decrease of slope efficiency with increasing temperature. The figure includes highly stylized L-I curves for two temperatures T(1) and T(2). As mentioned above, the laser diode's operation at the lower temperature is characterized by a lower threshold current and a higher slope efficiency than its operation at the higher temperature. For the examples shown, it is assumed that the bias current will be at or above the knee. A particular mechanism for controlling bias current uses a back facet monitor photodiode, which is typically packaged with the laser diode. The photodiode provides a signal representative of the average optical power output by the laser diode. This signal is then used in a feedback loop to vary the bias current in a way that maintains the average optical power at a desired level. This average output level is denoted $P_{av}$.

At the lower temperature, a given amount of modulation current $I_{mod}(1)$ gives rise to a swing in output power between $P_0(1)$ and $P_1(1)$, with the control loop maintaining the bias current at a value $I_{bias}(1)$. At the higher temperature, for the same amount of modulation current $I_{mod}(1)$, the bias current is maintained at a value $I_{bias}(1)$ to maintain the same average power, but due to the lower slope efficiency, the swing in output power is limited to a significantly smaller swing between $P_0(2)$ and $P_1(2)$. This leads to a significantly lower extinction ratio. To achieve the larger swing, the modulation current would have to be larger, say $I_{mod}(2)$, with a corresponding decrease in the bias current to a value $I_{bias}(2)$.

Laser Diode Driving Circuit

Figure 3:
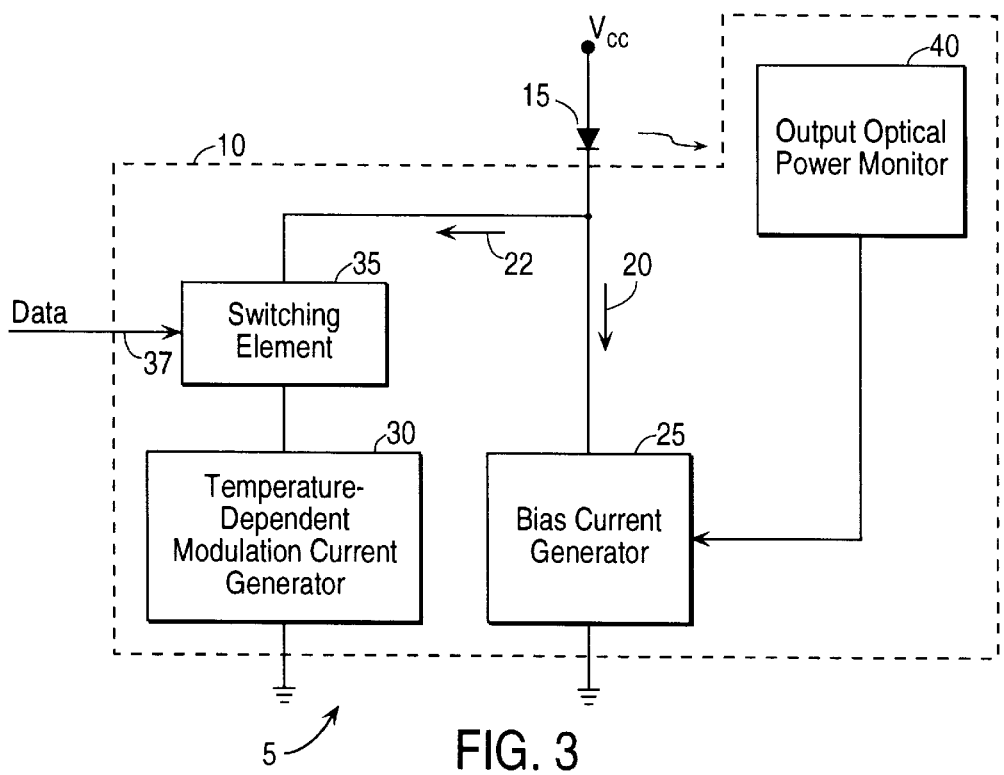
FIG. 3 is a high-level block diagram of a laser diode driving circuit according to an embodiment of the invention.

FIG. 3 is a high-level block diagram of a laser diode transmitter module 5 having a driving circuit 10 for providing controlled drive current to a laser diode 15. The laser diode is forward biased, and current flowing through the laser diode is directed to ground through a bias current path 20 and a modulation current path 22, which are connected in parallel to the cathode of the laser diode. A bias current generator 25 is disposed in bias current path 20 and causes a constant, or at least slowly varying bias current to flow through the laser diode. A modulation current generator 30 and a switching element 35 are disposed in modulation current path 22, and modulation current generator 30 causes an additional current to flow through the laser diode when switching element 35 is closed. The switching element has a control input 37, and thus operates to impress a desired data pattern on the current flowing along the modulation current path.

Modulation current generator 30 is temperature-dependent in the sense that its current depends on the operating temperature. In particular, the temperature dependence is tailored to provide a temperature dependence in the modulation current that compensates for the temperature-dependent changes in the slope efficiency. As discussed above, at higher temperatures, the slope efficiency typically falls off, thereby resulting in a lower extinction ratio for the same modulation current. Accordingly, the temperature-dependent modulation current typically increases as a function of temperature. Also shown in FIG. 3 is an optical power monitor 40 for maintaining the average output power of the laser diode at a constant desired level in the face of temperature changes.

Figure 4:
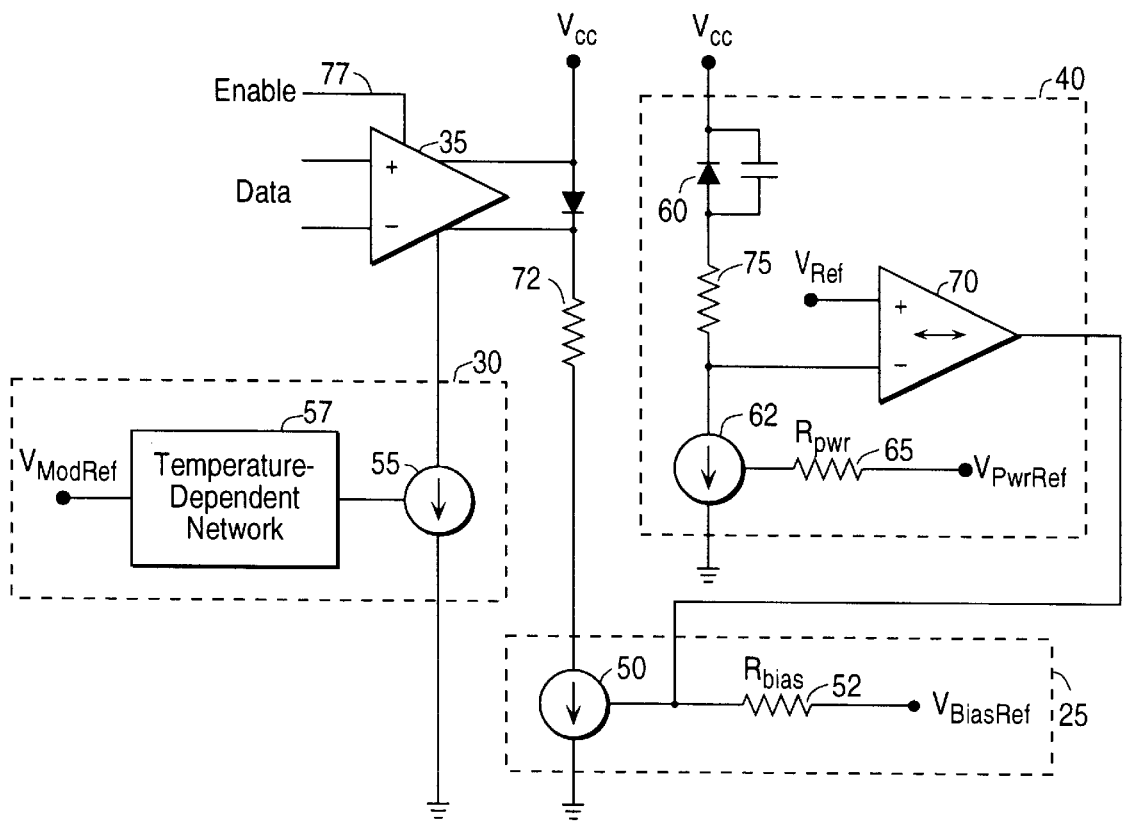
FIG. 4 is a detailed block diagram of a laser diode driving circuit according to an embodiment of the invention.

FIG. 4 is a detailed block diagram of an embodiment of laser diode driving circuit 10. In this embodiment, bias current generator 25 is implemented by a current mirror source 50, which provides a current that is proportional to a bias reference current. The bias reference current is supplied by a bias reference voltage $V_{BiasRef}$ applied to a bias reference resistor 52 (having resistance $R_{bias}$). Modulation current generator 30 is implemented by a current mirror source 55, which provides a current that is proportional to a modulation reference current. The modulation reference current is supplied by a modulation reference voltage $V_{ModRef}$ applied to a temperature-dependent resistor network 57.

Optical power monitor 40 is implemented by a backfacet monitor photodiode 60 connected in series with a current mirror source 62, which provides a current that is proportional to a power reference current. The power reference current is supplied by a power reference voltage $V_{PwrRef}$ applied to a power reference resistor 65 (having resistance $R_{pwr}$). A transconductance amplifier 70 has its inverting input connected to the node between current mirror source 62 and the photodiode, its non-inverting input connected to a threshold reference voltage, and its output connected to the control input of bias current mirror source 50. Resistors 72 and 75 are interposed in the bias current path and the photodiode current path to provide voltages that allow the two currents to be monitored. These resistors are sufficiently low value (say 10 Ω and 100 Ω, respectively) that they do not disturb the overall operation. The driving circuit preferably includes an enable/disable input 77 to allow switching element 35 to be prevented from modulating the laser diode current.

Current mirror source 62 draws a fixed current set by the power reference current. When the photodiode's average current is equal to this fixed current, the transconductance amplifier does not draw or provide current to the control input of bias current mirror source 50. On the other hand, when the average photodiode current differs from the current established by current mirror source 62, a voltage appears across the inputs of the transconductance amplifier, which then changes the current at the control input to bias current mirror source 50. For example, if the monitor photodiode's current is greater than the current established by current mirror source 62, signifying excessive laser diode output power, transconductance amplifier sinks current, thereby lowering the current input to bias current mirror source and lowering the bias current. This in turn lowers the laser diode output power, which lowers the photodiode current until the photodiode current and the current established by current mirror source are equalized.

Figure 5:
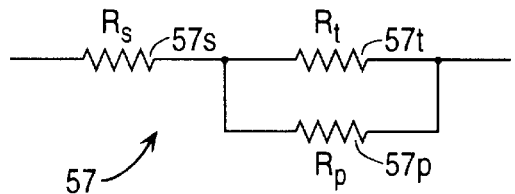
FIG. 5 is a circuit schematic of a representative implementation of a temperature-dependent resistor network used in embodiments of the invention.

FIG. 5 is a circuit schematic of a representative implementation of temperature-dependent resistor network 57. In this implementation, the network comprises a series resistor 57s (having resistance $R_s$) in series with the parallel combination of a thermistor 57t (having resistance $R_t$) and a parallel resistor 57p (having resistance $R_p$). Since the slope efficiency normally decreases with temperature, the thermistor has a negative temperature coefficient to result in higher modulation currents for higher temperatures.

In a specific embodiment, the active circuit elements shown in FIG. 4 were provided by a commercially available laser diode driver chip available from Maxim Integrated Products, Sunnyvale, Calif. under Model No. MAX3261. The driver chip includes an onboard voltage reference generator, which is used to provide the reference levels designated $V_{BiasRef}$, $V_{ModRef}$, and $V_{PwrRef}$ in the figure. Bias reference resistor 52, temperature-dependent resistor network 57, and power reference resistor 65 are provided as external components.

Other commercially available laser driver chips can be used to implement the invention, so long as they allow the use of external circuitry to set the desired modulation current. An example would be a laser driver chip available from SONY Electronics under Model No. CXB1549Q.

Calibration Procedure

Figure 6:
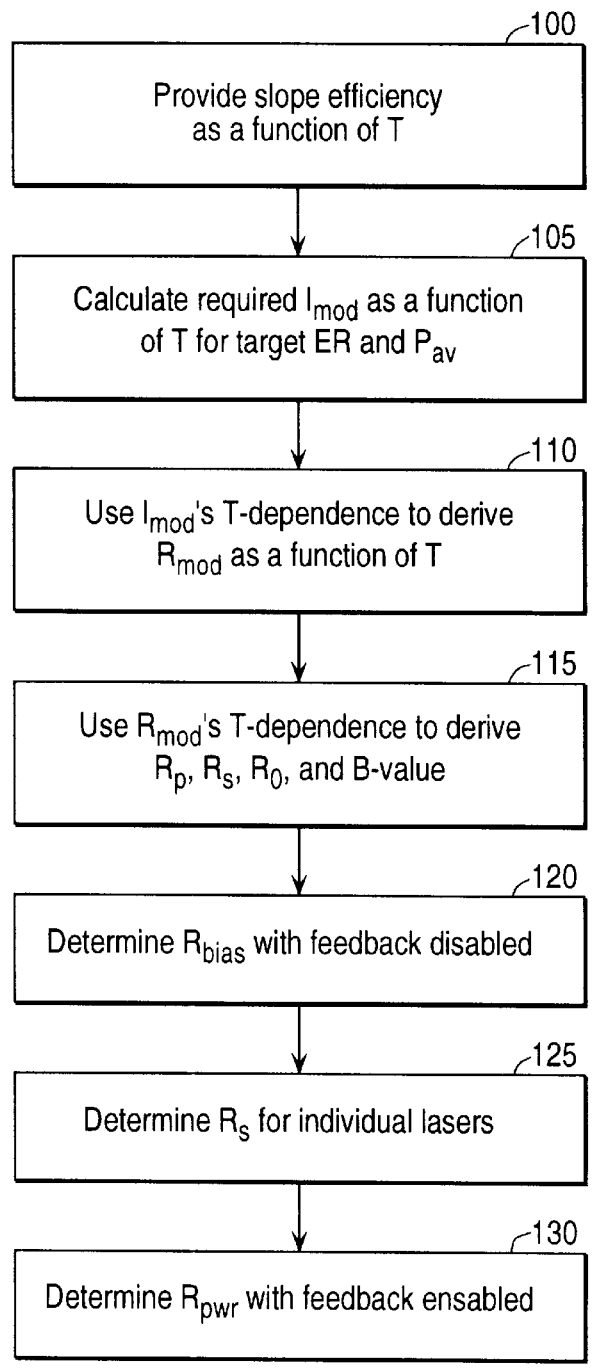
FIG. 6 is a flowchart of a calibration method according to embodiments of the invention.

FIG. 6 is a flowchart of a calibration method according to embodiments of the invention. FIGS. 7A–7F include plots of various relevant quantities as functions of temperature, and are referred to in connection with the description of FIG. 6.

Figure 7A:
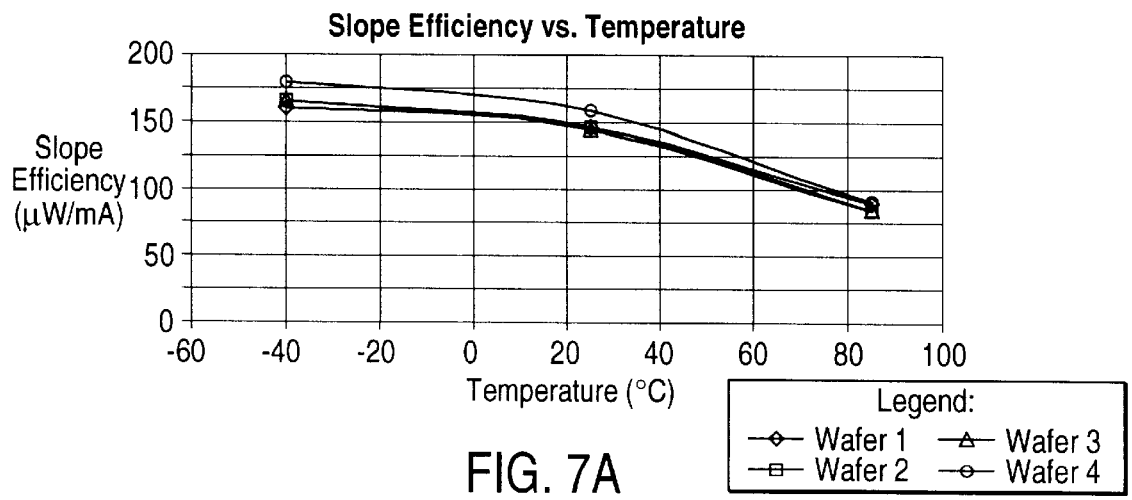
FIG. 7A includes plots of slope efficiency as a function of temperature for various lasers of the same type.

The slope efficiency as a function of temperature is determined at an initial step 100. This may be accomplished by direct measurements of the laser, or can be derived from information provided by the laser manufacturer. FIG. 7A includes plots of slope efficiency (measured in microwatts/milliamp) as a function of temperature for a number of individual instances of the same type of laser. In this case, the laser is a Fujitsu Model FLD3F8HF distributed feedback (DFB) laser. The results in the plots were supplied by the manufacturer for lasers from four different wafers manufactured using nominally the same process.

Figure 7B:
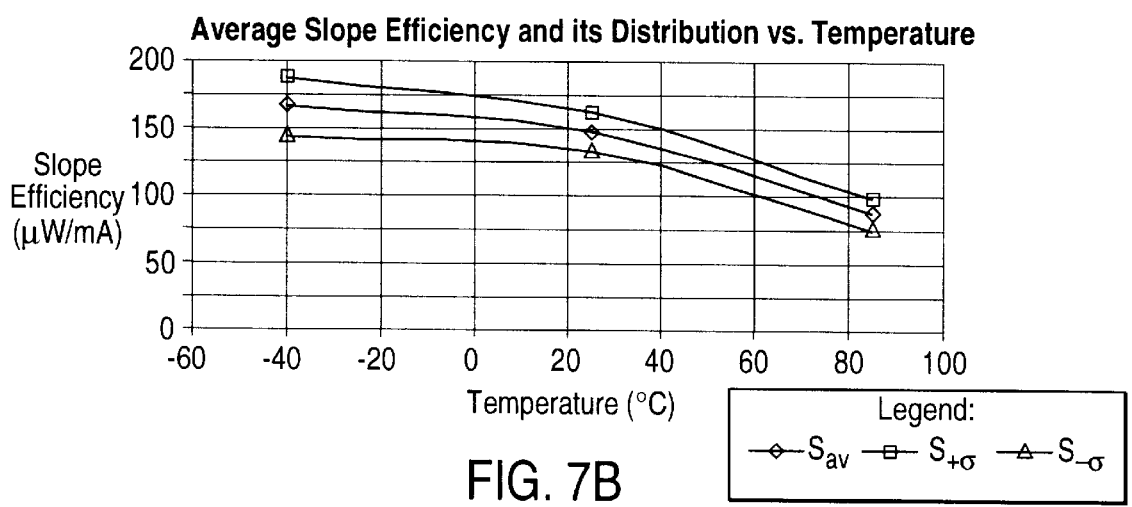
FIG. 7B includes plots showing the statistical behavior of slope efficiency as a function of temperature for lasers of the same type.

FIG. 7B includes plots showing the statistical behavior of slope efficiency as a function of temperature, derived from a more extensive population of lasers of the same type. The figure shows a plot of the average slope efficiency $S_{av}$ as a function of temperature, bounded by plots of $S_{-\sigma}$ and $S_{+\sigma}$ representing one standard deviation ($\sigma$) above and below the average. As can be seen, the slope efficiency falls off by a factor of two over a temperature range of –40° C. to 85° C.

Figure 7C:
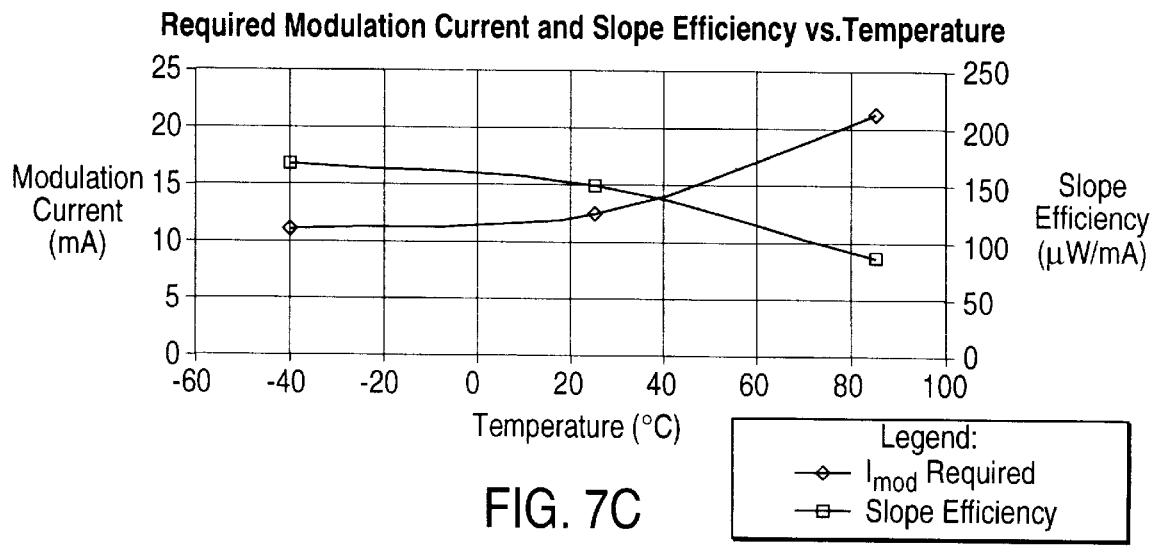
FIG. 7C includes a plot of required modulation current as a function of temperature, superimposed on a plot of the average slope efficiency as a function of temperature.

The required modulation current (for a target extinction ratio and average optical power) as a function of temperature is determined at a step 105. The temperature-dependence of the required modulation current correlates inversely with the temperature-dependence of the slope efficiency, as was illustrated in FIG. 2 and as can be seen in FIG. 7C. FIG. 7C includes a plot of required modulation current (in milliamps) as a function of temperature, superimposed on a plot of the average slope efficiency (in microwatts/milliamp) as a function of temperature.

The temperature-dependence of the required modulation current is translated to a desired temperature-dependence of resistor network 57 at a step 110. Where a commercial laser driver chip is used, the relationship between modulation current and the value of the setting resistor is typically provided by the chip manufacturer. In a particular instance, coefficients for a fifth-order polynomial are provided to allow the required resistance to be expressed as an analytical function of modulation current. Since the required modulation current as a function of temperature had been determined in step 105, it is possible to determine the desired temperature-dependence of resistor network 57 by curve fitting.

Figure 7D:
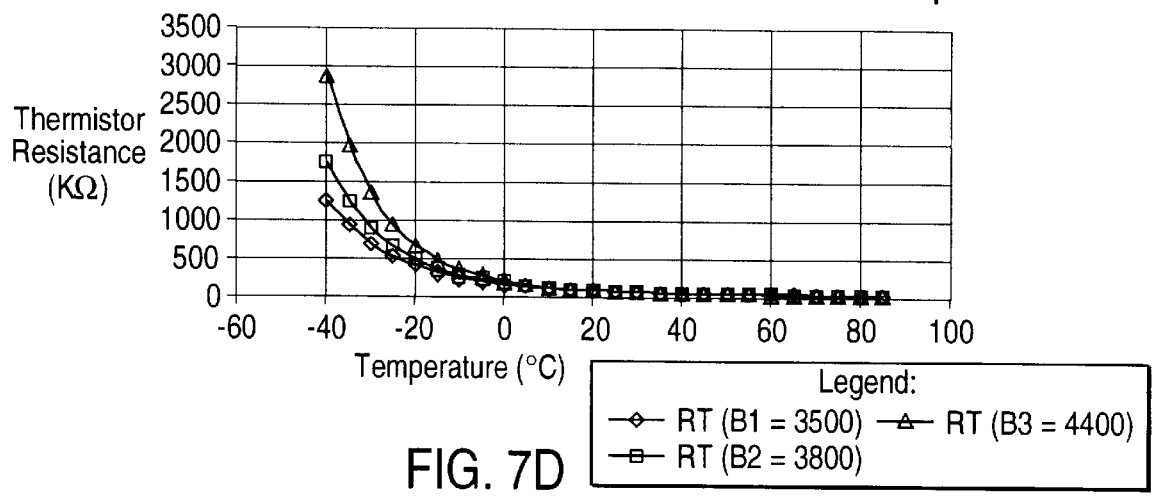
FIG. 7D includes plots of resistance as a function of temperature for various negative-temperature-coefficient (NTC) thermistors.

Curve fitting is performed to select optimum resistor and thermistor values at a step 115. FIG. 7D shows the resistance of negative-temperature-coefficient (NTC) thermistors as a function of temperature for three different B-values. As can be seen, the resistance of a typical NTC thermistor changes from 1.24 MΩ to 6.5 KΩ (i.e., by a factor of almost 200) from −40 to 85° C. As shown in FIG. 7A, a typical laser slope efficiency changes by a factor of about 2 over the same temperature range. The purpose of parallel resistor 57$p$ in resistor network 57 is to desensitize the aggregate resistance slope as a function of temperature.

Figure 7E:
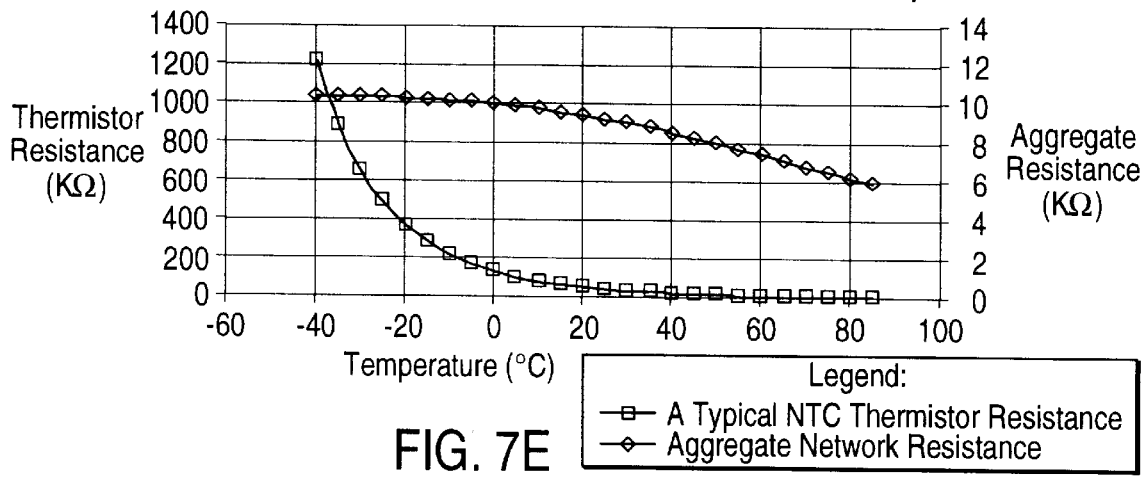
FIG. 7E includes a plot showing how the parallel resistor in the resistor network desensitizes the aggregate resistance slope as a function of temperature.

FIG. 7E includes a plot showing how this occurs for the combination of a thermistor (B=3500) in parallel with a resistor on the order of 8.2 KΩ, with the combination in series with a resistor on the order of 2.5 MΩ. The figure also includes a plot showing the thermistor temperature dependence. As will be discussed below, series resistor 57$s$ is used to adjust the aggregate resistance without changing the slope once the parallel resistor value $R_p$ and the thermistor value $R_t$ have been specified.

The curve fitting requires that the temperature dependence of the thermistor be known. By way of background, thermistor behavior generally follows the following behavior:

$$R_t(T)=R_0 e^{-[B/(273+25)-1/(273+T)]}$$

where $R_0$ is the resistance of the thermistor at 25° C., and B is a characteristic of the thermistor referred to as the B-factor.

Figure 7F:
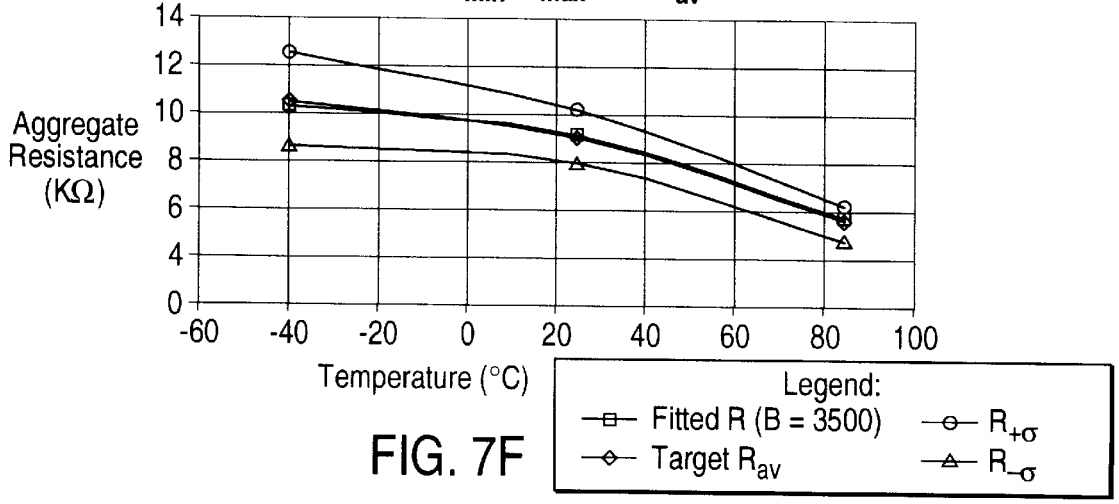
FIG. 7F includes plots showing how the curve fitting matches the desired temperature-dependence.

FIG. 7F includes a plot of the curve as fit to a plot of the target average required resistance $R_{av}$ based on the average slope efficiency $S_{av}$ for a particular type of laser diode. The figure also includes plots of the target required resistances $R_{-\sigma}$ and $R_{+\Delta\sigma}$ corresponding to the statistical behavior of the slope efficiency of that type of laser diode. Curve fitting is based on a numerical solution of the root-mean-square error function (between fitted R and target $R_{av}$) by optimizing $R_s$, $R_p$, $R_0$ with the available B parameters.

The appropriate value for bias resistor 52 is determined at a step 120. The value $R_{bias}$ is varied until the target values of extinction ratio and average power are achieved. This is preferably done at room temperature (25° C.) with the bias feedback circuit disabled. Disabling the bias feedback circuit avoids a possible situation where the automatic power control would cause a setting that would be near an edge of the possible range. Possible adjustments may need to be made to the series resistor value $R_s$ to account for variations among various lasers of the same type. It is, of course, possible to perform the curve fitting for each individual laser, but where throughput is an issue, it generally suffices to use the same thermistor and parallel resistor values for all the lasers of a given type, and account for differences in the slope efficiency by changing the series resistor value $R_s$. An intermediate solution is to determine separate sets of values for the thermistor and parallel resistor based on fitting the $R_{min}$ and $R_{max}$ curves, and use those values for laser diodes having slope efficiency curves in the upper and lower quartiles of the range.

The value $R_{pwr}$ of power reference resistor 65 is determined at a step 130. This should be done with the bias feedback circuit enabled, and after the above room temperature parameters have been established. The value of $R_{pwr}$ is set so that the average power remains the same as it was when the bias feedback mechanism was disabled.

Experimental Results

Laser diode driving circuits as described above in connection with FIGS. 3–5 were constructed, coupled to various laser diodes, and calibrated in accordance with the calibration procedures described above in connection with FIGS. 6 and 7A–7C. Experimental results are discussed below in connection with FIGS. 8A–8C, 9A–9C.

Figure 8A:
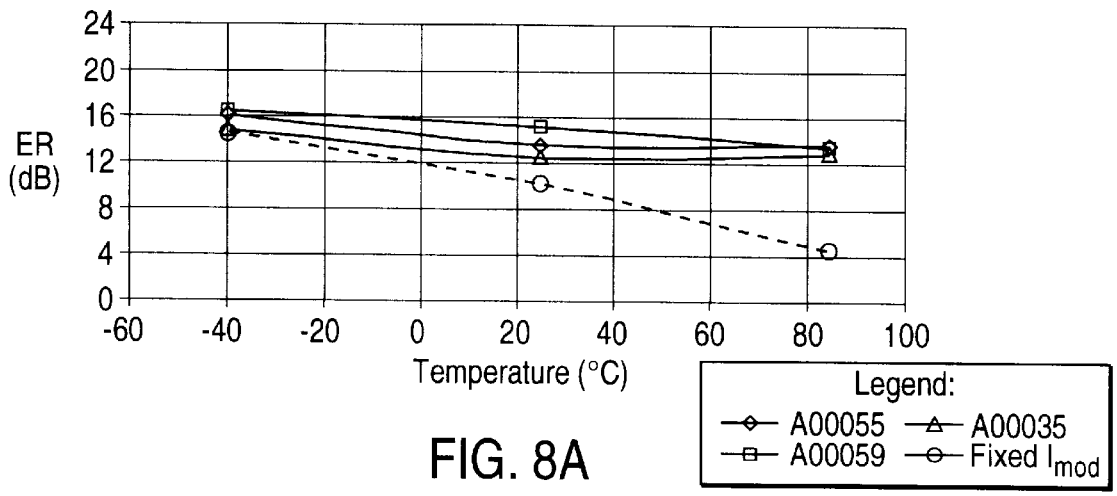
Figure 8B:
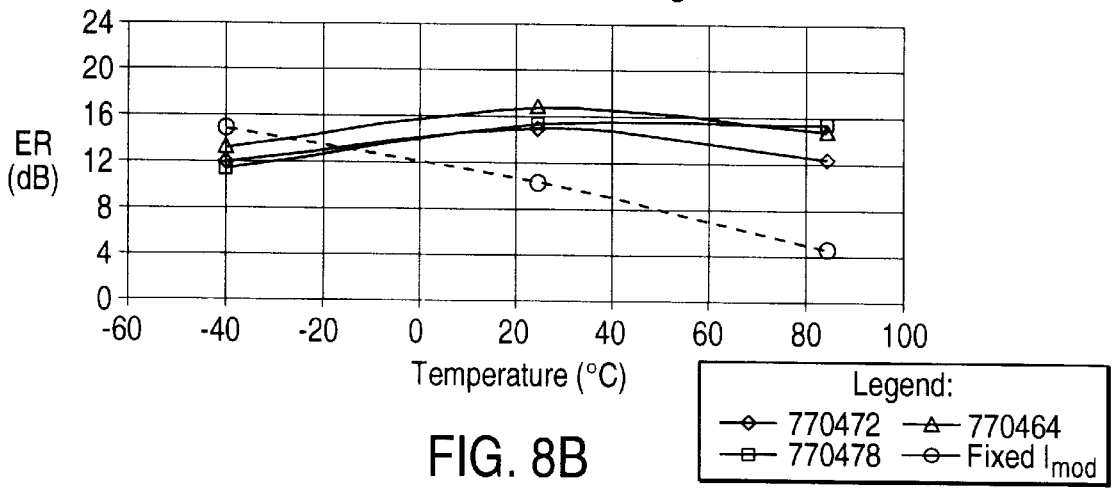
Figure 8C:
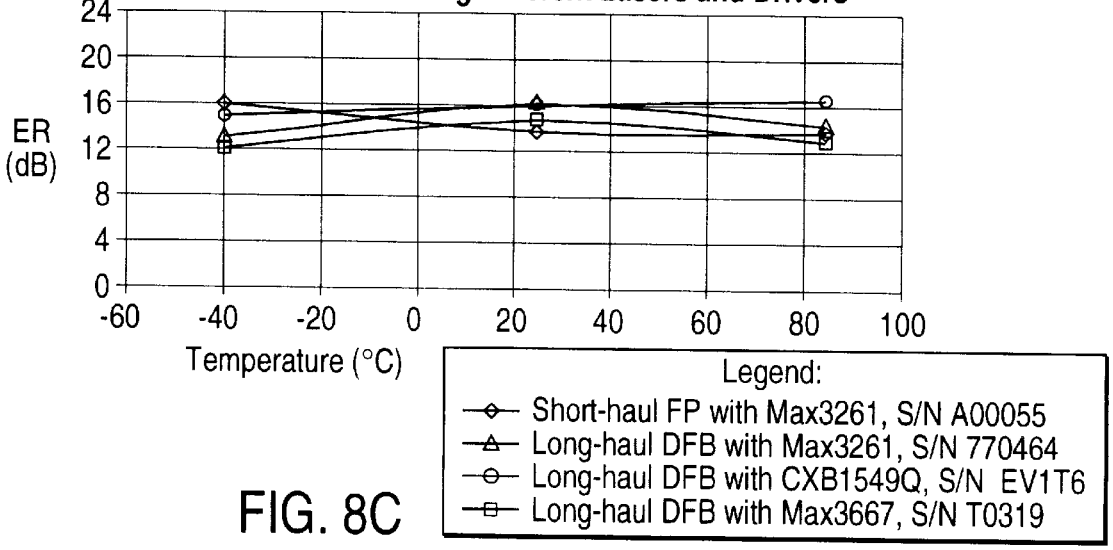

FIGS. 8A–8C include plots of extinction ratio as a function of temperature for different lasers and different laser driver chips. Each figure includes, in phantom, a representative plot of extinction ratio as a function of temperature where a fixed modulation current is used. FIG. 8A includes plots for three short-haul Fabry-Perot (F-P) lasers using a Maxim Max3261 laser driver chip. FIG. 8B includes plots for three long-haul distributed feedback (DFB) lasers using the Max3261 chip. FIG. 8C includes one plot from each of FIGS. 8A and 8B, and two additional plots for long-haul lasers using a Sony CXB1549Q chip and a Maxim Max3667 chip. As can be seen from the plots, the extinction ratio is significantly more uniform over the extended temperature range.

Figure 9A:
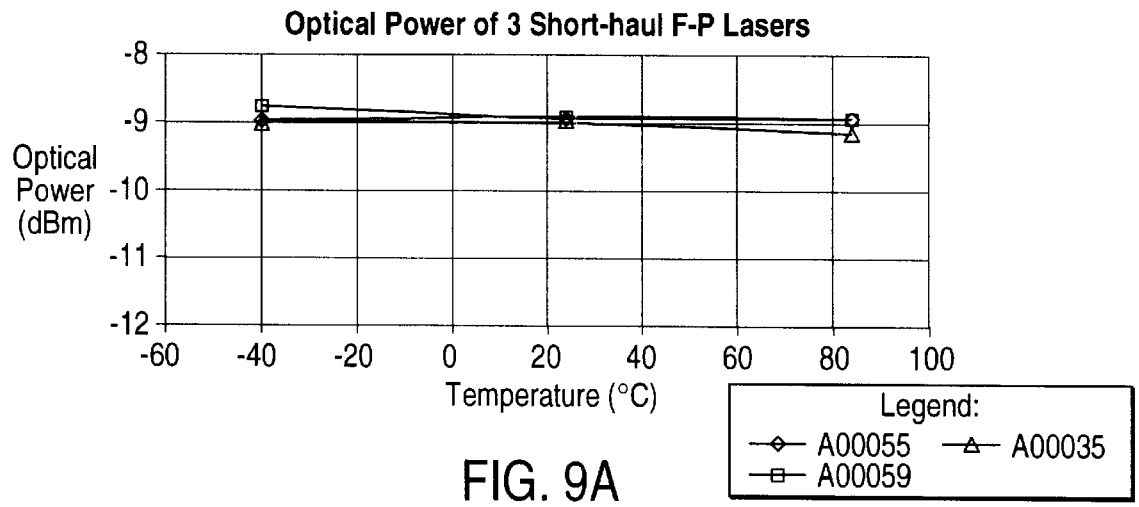
FIGS. 9A–9C include plots of average optical power as a function of temperature for the sets of lasers and driver chips corresponding to those of FIGS. 8A–8C.
Figure 9B:
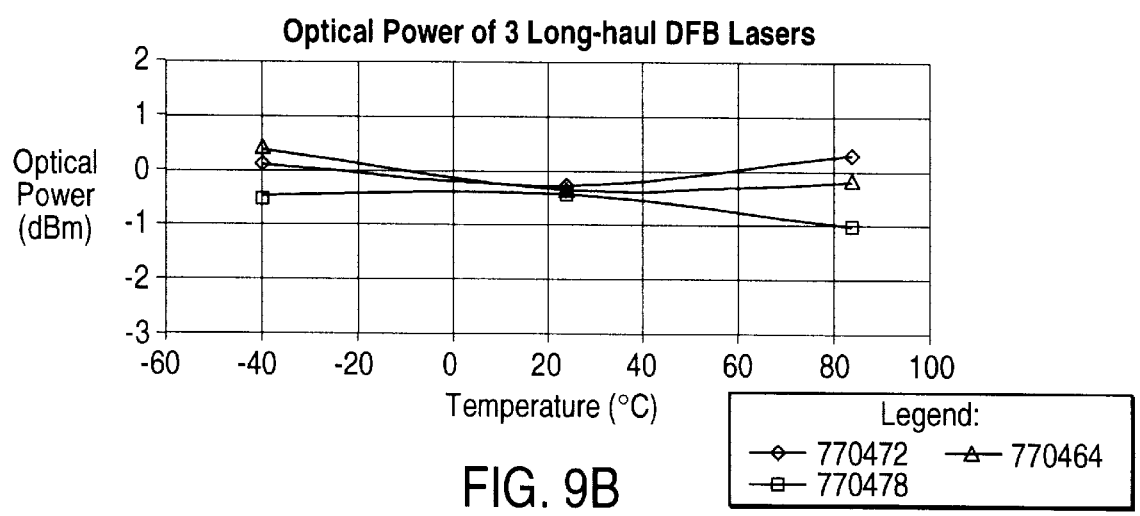
Figure 9C:
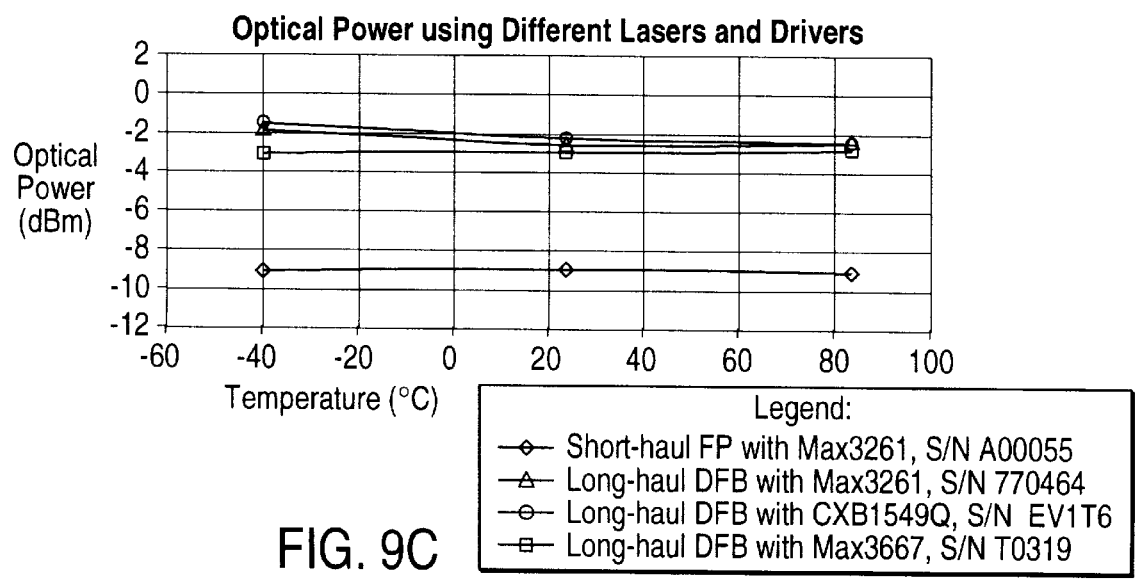

FIGS. 9A–9C include plots of average optical power as a function of temperature for the sets of lasers and driver chips corresponding to those of FIGS. 8A–8C. The power is measured in dBm where 0 dBm corresponds to 1 milliwatt, and the general transformation is P(dBm)=10log(P(mw)/1 mw).

Figure 10A:
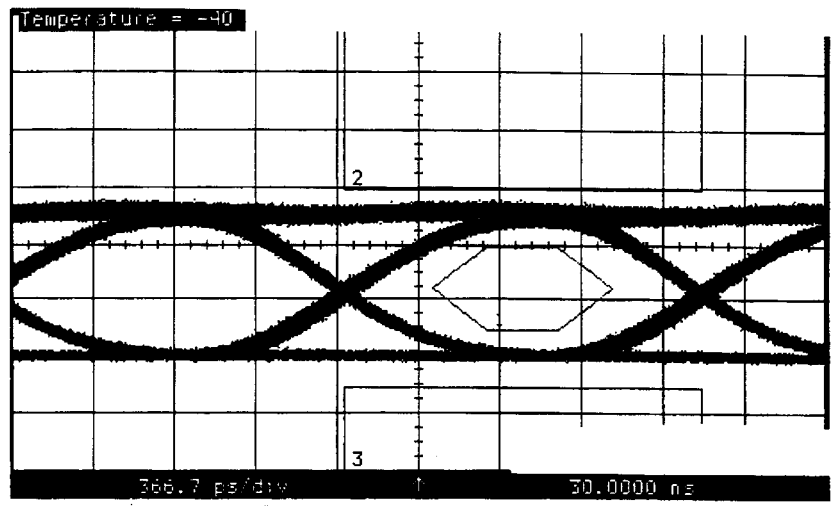
FIGS. 10A–10L are eye diagrams for selected ones of the modules.
Figure 10B:
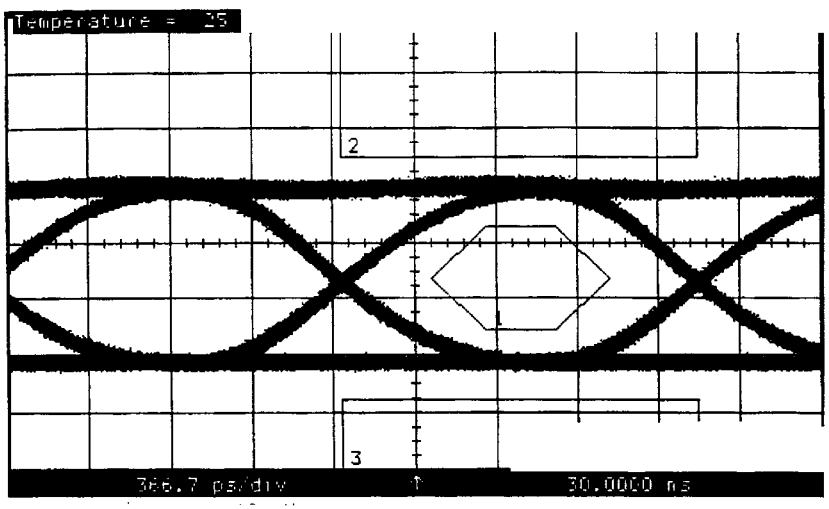
Figure 10C:
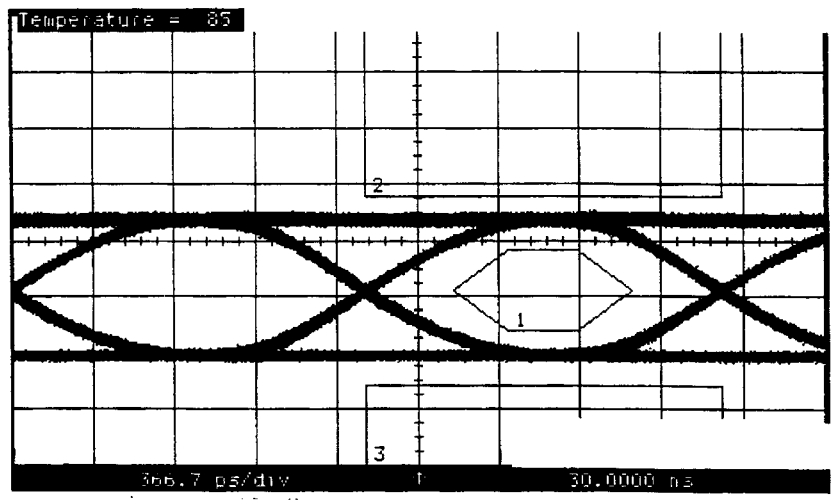
Figure 10D:
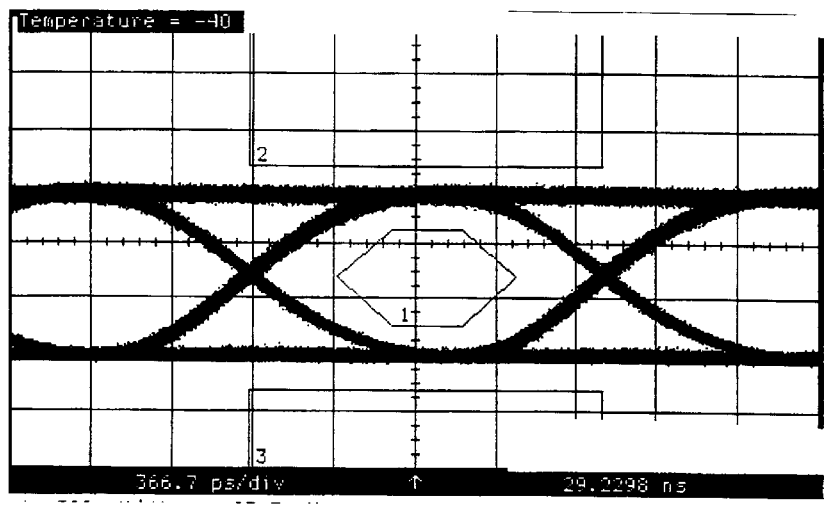
Figure 10E:
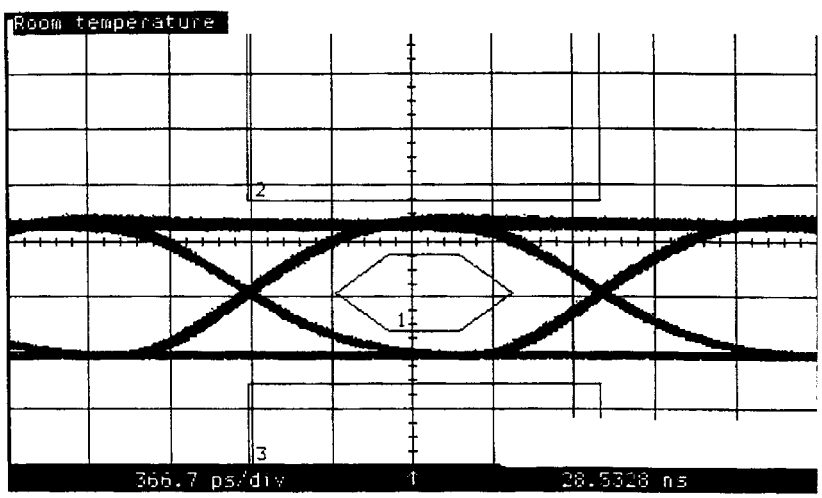
Figure 10F:
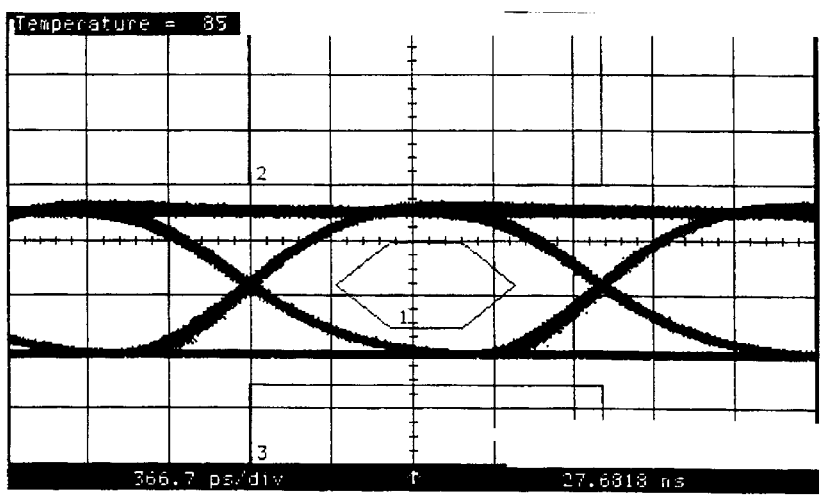
Figure 10G:
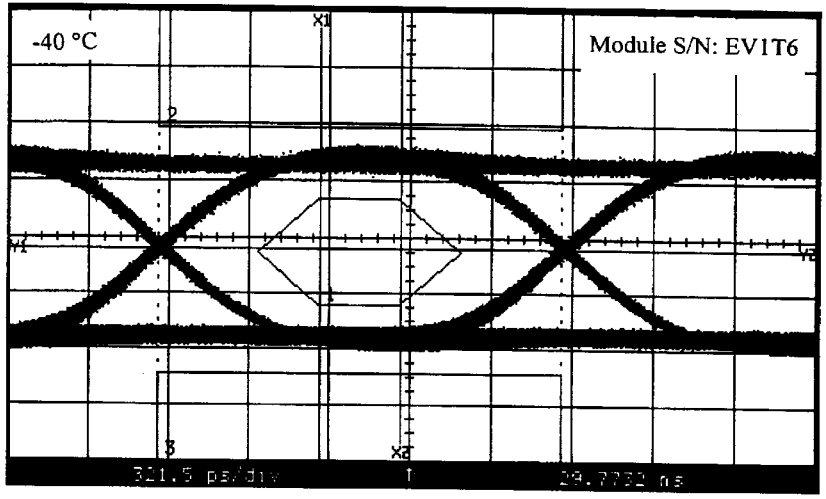
Figure 10H:
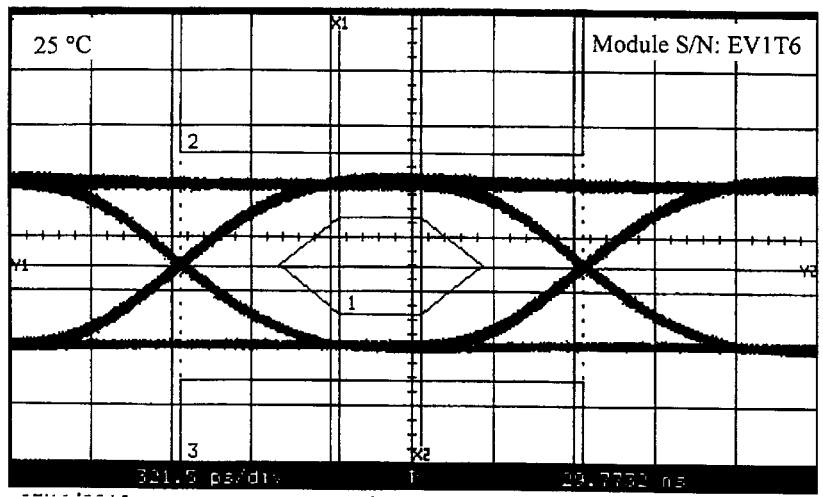
Figure 10I:
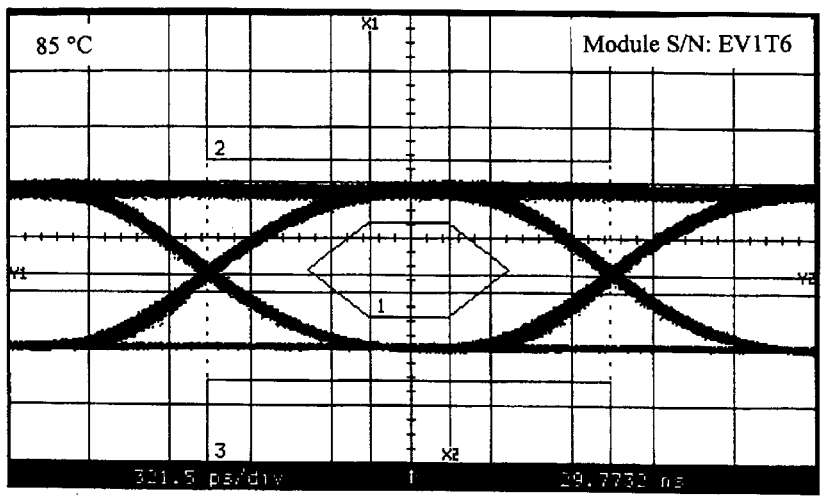
Figure 10J:
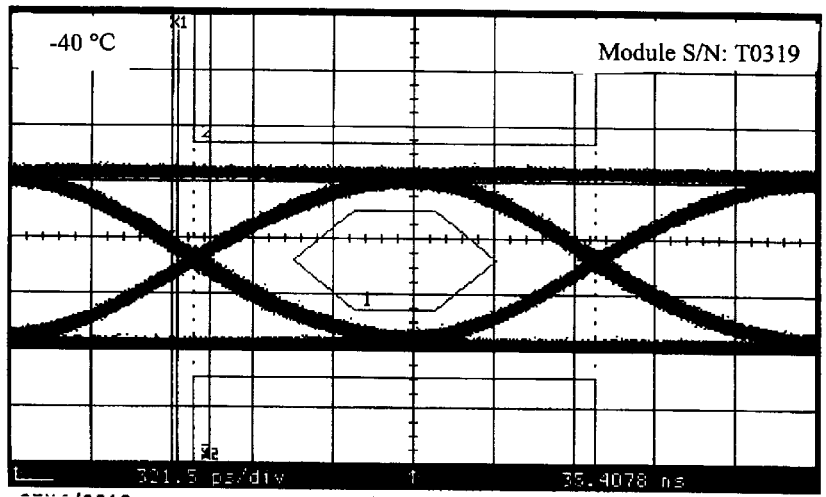
Figure 10K:
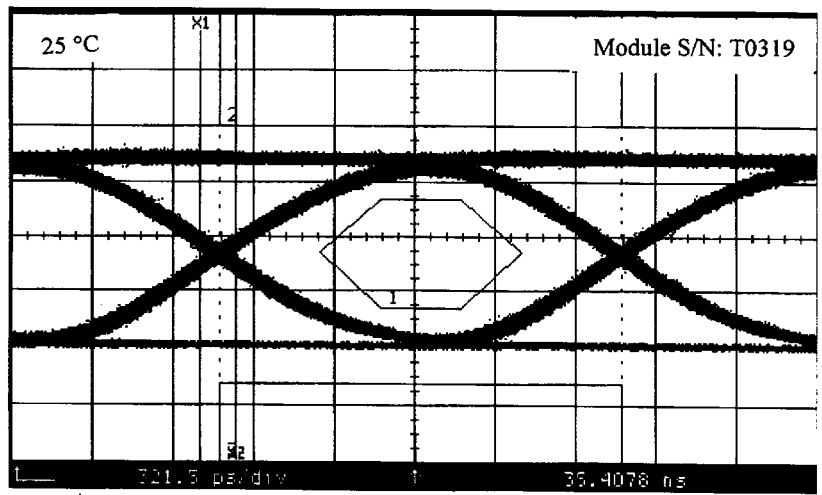
Figure 10L:
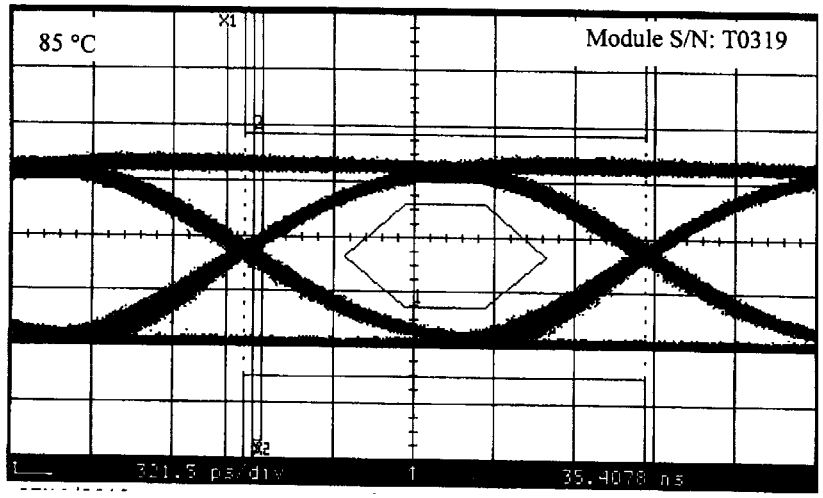

FIGS. 10A–10L are eye diagrams for selected ones of the modules whose extinction ratio and average optical power plots were discussed above. In particular, FIGS. 10A–10C are eye diagrams for the first module listed in the legend in FIG. 8C, measured at −40° C., 25° C., and 85° C., FIGS. 10D–10F are eye diagrams for the second module for the same three temperatures, FIGS. 10G–10I are eye diagrams for the third module for the same three temperatures, and FIGS. 10J–10L are eye diagrams for the fourth module for the same three temperatures.

As can be seen, the modules meet or exceed the specified eye mask standard over the extended temperature range. By way of background, each eye diagram is an oscilloscope trace of the measured optical power for an extended random pattern of logical 0's and 1's. The eye diagram provides a visual indication as to whether 0's and 1's are being adequately differentiated so that the transitions can be adequately detected. Each eye diagram includes an eye mask, consisting of three areas, a central hexagon and upper and lower rectangles. Traces are not allowed to fall inside any of these regions. Quantitative measures include the extinction ratio, the rise and fall times, and the quantity Q, which is given by:

$$Q=(I_1-I_0)/(\sigma_1+\sigma_0)$$

where $I_1$ and $I_0$ are the average power levels for a logical 1 and a logical 0, and $\sigma_1$ and $\sigma_0$ are the standard deviations representing the non-uniformities of the levels.

Network Applications

Figure 11A:
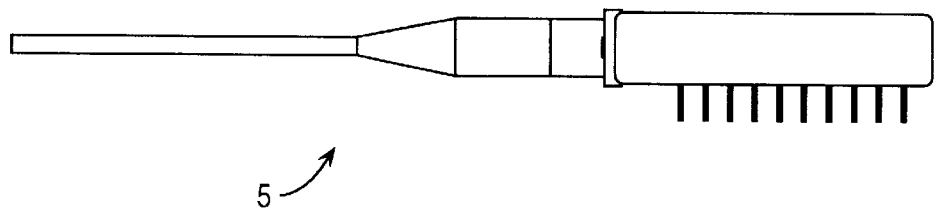
FIGS. 11A and 11B are and bottom views of a fiberoptic transmitter module incorporating the present invention.
Figure 11B:
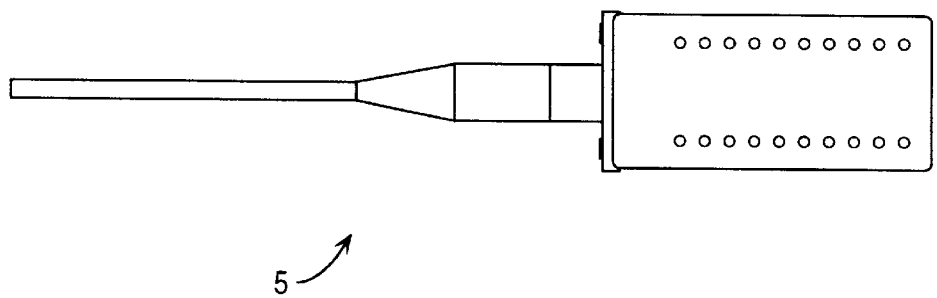

FIG. 11A and 11B are side and top views of a packaged fiberoptic transmitter module incorporating the present invention. Techniques for packaging electro-optic and opto-electric modules are known in the art, and will not be described further.

Figure 12:
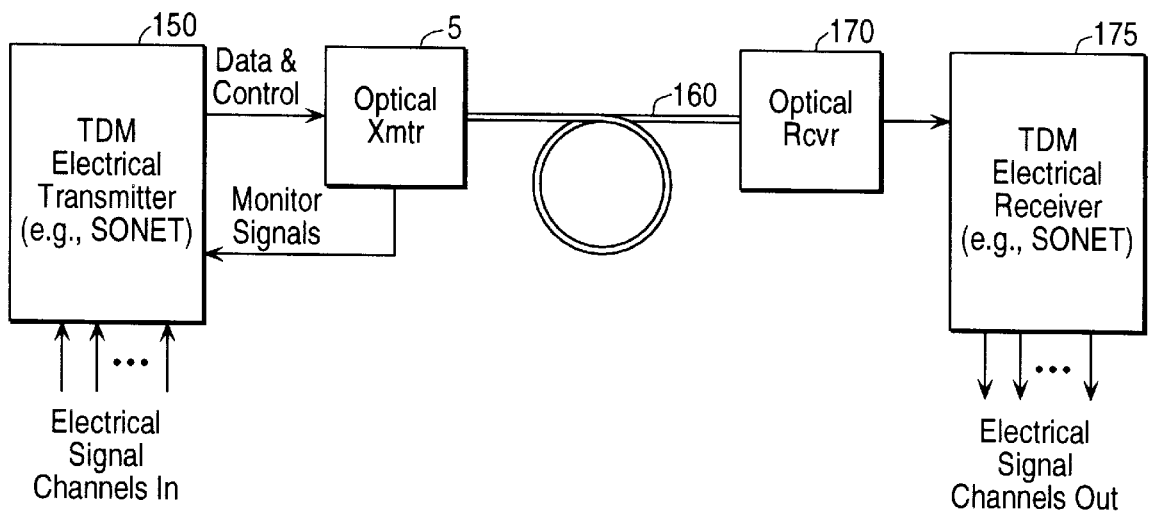

FIG. 12 is a block diagram showing the disposition of laser diode transmitter module 5 in a fiber optic network environment. The present invention is suitable for digital modulation applications such as in optical communication links (i.e., Sonet, SDH, ATM, etc., networks), in which it is desired to maintain constant high extinction ratio and stable optical output power while meeting or exceeding specified eye mask standards. Since the invention is directed to providing operation over a wide range of temperatures, the laser wavelength varies. Thus the module is generally not suitable for use in WDM networks.

In a typical network, module 5 receives electrical data and control signals from terminal equipment 150, which may itself include a number of time-multiplexed signal channels (e.g., including data and voice). The data signals are used to modulate the laser in the module, and the modulated light is injected into a network fiber 160. Light emerging from the other end if the fiber is detected in a receiver 170, the details of which are not relevant to the present invention. The receiver converts the optical signal into an electrical signal which is received by terminal equipment 175.

Conclusion

In conclusion it can be seen that the present invention provides an effective and elegant solution to problems in controlling laser diodes over a wide range of temperatures. The invention is readily adapted to existing laser diode drivers to provide an extra level of configurability.

While the above is a complete description of specific embodiments of the invention, various modifications, alternative constructions, and equivalents may be used.

For example, the invention can be modified slightly to take tracking errors into account, as will now be explained. The above description assumed that optical power monitor 40 maintained the output optical power constant by maintaining the current through monitor photodiode 60 constant. In fact, laser diode packages having monitor photodiodes therein are prone to temperature-dependent tracking errors. In this context, the term "tracking error" refers to the fact that while the photodiode current is a linear function of the optical power falling thereon, the ratio of the optical power falling on the photodiode to the laser output power may vary slightly over a range of temperature due to imperfections in the manufacturing process. Thus, the bias feedback mechanism provided by optical power monitor 40 causes the average output power to vary with temperature. This causes the extinction ratio to vary with temperature. While the invention is generally not able to address the temperature dependence of the average output power, the invention can be adapted to maintain the target extinction ratio. This is accomplished by taking the tracking error into account in step 105 (FIG. 6) when calculating the required modulation current as a function of temperature.

Further, while the specific embodiment has the laser diode anode connected to the positive voltage supply, and the bias and modulation circuitry connected between the laser diode cathode and ground, other configurations are possible. For example, the laser diode cathode could be connected to ground, and the bias and modulation circuitry could be connected between the positive voltage supply and the laser diode anode.

Therefore, the above description should not be taken as limiting the scope of the invention as defined by the claims.

What is claimed is:

1. A laser diode driving circuit comprising:

means for establishing a bias current through the laser diode;

means for establishing a modulation current through the laser diode, said modulation current being superimposed on said bias current, said means for establishing a modulation current including an element with a temperature-dependent characteristic and being configured to compensate for temperature-induced changes in a slope parameter of the laser diode, the modulation current varying as a function of temperature in view of said temperature-dependent characteristic; and means, responsive to an input signal, for modulating said modulation current in accordance with said input signal.

2. The laser diode driving circuit of claim 1 wherein said means for modulating includes a differential driver.

3. The laser diode driving circuit of claim 1 wherein said means for establishing a bias current and said means for modulating are fabricated on an integrated laser diode driver chip.

4. The laser diode driving circuit of claim 1, and further comprising:

means for generating a monitor signal representative of a power output of the laser diode; and means, responsive to said monitor signal and coupled to said means for establishing a bias current so as to maintain the average power output of the laser diode constant.

5. The laser diode driving circuit of claim 1 wherein:

said element with a temperature-dependent characteristic is a thermistor;

said means for establishing a modulation current includes means for providing a reference current; and said means for providing a reference current includes a reference voltage source and a resistor network that includes said thermistor.

6. A laser diode driving circuit comprising:

means for establishing a bias current through the laser diode;

means, responsive a reference current, for establishing a modulation current through the laser diode, the modulation current varying as a function of said reference current and being superimposed on said bias current;

means, responsive to an input signal, for modulating said modulation current in accordance with said input signal; and means for communicating a temperature-dependent reference current to said means for establishing a modulation current, said means for communicating including an element with a temperature-dependent characteristic and being configured to compensate for temperature-induced changes in a slope parameter of the laser diode.

7. The laser diode driving circuit of claim 6 wherein said means for modulating includes a differential driver.

8. The laser diode driving circuit of claim 6 wherein said means for establishing a bias current and said means for modulating are fabricated on an integrated laser diode driver chip.

9. The laser diode driving circuit of claim 6, and further comprising:

means for generating a monitor signal representative of a power output of the laser diode; and means, responsive to said monitor signal and coupled to said means for establishing a bias current so as to maintain the average power output of the laser diode constant.

10. The laser diode driving circuit of claim 6 wherein:

said temperature-dependent element is a thermistor; and said reference current source includes a reference voltage source and a resistor network that includes said thermistor.

11. A laser diode driving circuit comprising:

a bias current circuit coupled to a node of the laser diode, said bias current circuit operating to maintain a bias current flowing through the laser diode;

a modulation current source disposed in a modulation current path coupled to the node of the laser diode, said modulation current source having a reference input terminal and controlling the current flowing along said modulation current path as a function of a reference current at said reference input terminal;

a switching element disposed in series with said modulation current source in said modulation current path, said switching element having a control input terminal and modulating the current flowing along said modulation current path in accordance with signals at said control input terminal;

said modulation current source and switching element thus providing a modulation current superimposed on said bias current, the laser diode having an optical power output with a time dependence corresponding to said signals at said control input terminal, the optical power output being characterized by a degree of modulation; and a reference current source coupled to said reference input terminal, said reference current source having a temperature-dependent element to provide a temperature-dependent reference current, the reference current source being configured such that said modulation current changes in a manner to at least partially compensate for temperature-dependent changes in said degree of modulation of the optical power output of the laser diode.

12. The laser diode driving circuit of claim 11 wherein said bias current circuit and said modulation current path are coupled between the cathode of the laser diode and a ground terminal.

13. The laser diode driving circuit of claim 11 wherein said switching element is a differential driver.

14. The laser diode driving circuit of claim 11 wherein said bias current circuit and said switching element are fabricated on an integrated laser diode driver chip.

15. The laser diode driving circuit of claim 11, and further comprising:

a monitor photodiode disposed to receive a portion of the optical power output of the laser diode; and a feedback element coupled to said bias current circuit so as to maintain the average power output of the laser diode constant.

16. The laser diode driving circuit of claim 11 wherein:

said temperature-dependent element is a thermistor; and said reference current source includes a reference voltage source and a resistor network that includes said thermistor.

17. A fiberoptic transmitter comprising:

a laser diode emitting optical energy;

means for establishing a bias current through the laser diode;

means for establishing a modulation current through the laser diode, said modulation current being superimposed on said bias current, said means for establishing a modulation current including an element with a temperature-dependent characteristic and being configured to compensate for temperature-induced changes in a slope parameter of the laser diode, the modulation current varying as a function of temperature in view of said temperature-dependent characteristic; and means, responsive to an input signal, for modulating said modulation current in accordance with said input signal.

18. The fiberoptic transmitter of claim 17 wherein said means for modulating includes a differential driver.

19. The fiberoptic transmitter of claim 17 wherein said means for establishing a bias current and said means for modulating are fabricated on an integrated laser diode driver chip.

20. The fiberoptic transmitter of claim 17, and further comprising:

means for generating a monitor signal representative of a power output of said laser diode; and means, responsive to said monitor signal and coupled to said means for establishing a bias current so as to maintain the average power output of the laser diode constant.

21. The fiberoptic transmitter of claim 17 wherein said means for generating a monitor signal comprises a monitor photodiode disposed to receive a portion of the optical power emitted by said laser diode.

22. The fiberoptic transmitter of claim 17 wherein:

said element with a temperature-dependent characteristic is a thermistor;

said means for establishing a modulation current includes means for providing a reference current; and said means for providing a reference current includes a reference voltage source and a resistor network that includes said thermistor.

23. A method of calibrating a laser diode transmitter module wherein the modulation current depends on temperature-dependent element, the method comprising:

determining a temperature-dependence of the laser diode's slope efficiency;

calculating a temperature-dependence of a required modulation current to maintain a target extinction ratio and average power;

determining a set of parameters for the temperature-dependent element so as to match the temperature-dependence of the required modulation current; and configuring the laser diode transmitter module with circuit elements having parameters, so determined.

24. The method of claim 23 wherein the set of parameters includes a set of thermistor parameters and a set of resistor parameters, and further comprising for an additional laser diode transmitter module having a laser diode that is nominally the same at the first-mentioned laser diode:

determining at least one different resistor parameter for the additional laser diode transmitter module; and configuring the additional laser diode transmitter module with circuit elements having the same thermistor parameters as used for the first-mentioned laser diode transmitter module but having the at least one different resistor parameter, so determined.

* * * * *